United States Patent [19]
Mifuji

[11] Patent Number: 5,533,253
[45] Date of Patent: Jul. 9, 1996

[54] APPARATUS AND METHOD FOR MOUNTING AN AIR-CORE COIL

[75] Inventor: Fumio Mifuji, Kasai, Japan

[73] Assignee: Sanyo Electric Co., Ltd., Osaka, Japan

[21] Appl. No.: 309,123

[22] Filed: Sep. 20, 1994

[51] Int. Cl.$^6$ .................................................. H05K 13/00
[52] U.S. Cl. ............................. 29/741; 29/743; 29/759; 29/834; 29/840
[58] Field of Search ................................. 29/602.1, 834, 29/840, 759, 740, 741, 743

[56] References Cited

U.S. PATENT DOCUMENTS

| | | | |
|---|---|---|---|
| 4,610,473 | 9/1986 | Hawkswell | 29/743 X |
| 4,901,432 | 2/1990 | Pine | 29/602.1 X |

FOREIGN PATENT DOCUMENTS 58-105199  7/1983  Japan.

Primary Examiner—Carl E. Hall
Attorney, Agent, or Firm—Willian Brinks Hofer Gilson & Lione

[57] ABSTRACT

In order that an air-core coil is sucked by a nozzle with its terminals being horizontal, the terminals of the air-core coil are brought into contact with horizontal regulating surface at the time of the suction or after the suction. The lower end surface of the nozzle is formed to be horizontal to serve as a regulating surface, and the upper surfaces of the terminals are brought into contact therewith. Alternatively, the upper surfaces or the undersurfaces of separately provided regulating plates serve as the regulating surfaces, and the undersurfaces of the upper surfaces of the terminals are brought into contact therewith.

5 Claims, 10 Drawing Sheets

APPARATUS AND METHOD FOR MOUNTING AN AIR-CORE COIL

BACKGROUND OF THE INVENTION

1. Field of the Invention

The present invention relates to an apparatus for mounting an electronic part, and more particularly, to an apparatus and a method for mounting an air-core coil.

2. Description of the Prior Art

Automatic electronic part mounting apparatuses are used to efficiently mount various types of electronic parts on a printed circuit board. The automatic electronic part mounting apparatus has a plurality of part feeding units and a pick and place unit which takes a part out of a part supplier and carries it to mount it on the printed circuit board. The following types of electronic part mounting apparatuses have been put into practical use: a Cartesian coordinates type having one pick and place unit; and a rotary table type having a plurality of pick and place heads arranged around a rotary index table. Electronic parts are supplied, for example, being in a plastic-made tape 7 having pockets 8 for holding the parts therein as shown in FIGS. 7 and 19. The width of the tape 7 and the size of the pockets 8 vary according to the size of the parts held therein. The tape 7 is conveyed at a predetermined timing at a pitch according to the distance between the pockets 8 so that the electronic parts are supplied one after another.

The commonest method employed by the pick and place units is to suck the electronic part by vacuum suction. The pick and place unit sucks an electronic part to take it out of the pocket of the tape, and carries it to mount it on a predetermined position on a printed circuit board arranged at a predetermined position. The pick and place unit provided at an upper portion of the automatic electronic part mounting apparatus includes an X-Y table movable horizontally, a head attached to the undersurface of the X-Y table so as to be movable upward and downward, and a nozzle arranged at the lower end of the head for sucking the parts. The nozzle is formed to fit the size and configuration of the parts. Several kinds of nozzles are available for the pick and place unit so that an appropriate nozzle for the part to be mounted may be selected thereamong.

The nozzle selected according to the part is moved by the movement of the X-Y table to a position above the electronic part held in the pocket of the tape. Then, the nozzle is lowered to the vicinity of the top surface of the electronic part by the downward movement of the head, and sucks the electronic part by vacuum suction to take it out of the pocket. Thereafter, the head moves upward, and the X-Y table moves to move the nozzle to a position above a predetermined position on the circuit board. Then, the head moves downward again, and when the bottom surface of the electronic part comes in contact with the circuit board, the head stops sucking the part to mount it on the predetermined position on the circuit board.

Various electronic parts such as a semiconductor chip, a capacitor and a resistor are mounted on the printed circuit board, and an air-core coil is one of such electronic parts. The air-core coil has terminals 4 horizontally protruding from both ends of coil turns 5 in the opposite directions as shown in FIGS. 17 and 18. The number of turns and the diameter of the turns vary according to the purpose, and various kinds of air-core coils have been put into practical use. When supplied for an automatic electronic part mounting apparatus, the air-core coil 3 is held in the pocket 8 of the tape 7 with its terminals 4 located at the bottom as shown in FIG. 19.

The portion of the nozzle which comes in contact with the electronic part is processed into a configuration in accordance with the configuration of the part so that the nozzle surely sucks the part without dropping it while carrying it. For example, Japanese Laid-open Utility Model Application S58-105199 discloses a nozzle of a configuration as shown in FIG. 1. This type of nozzle is suitable for sucking a cylindrical electronic part with enlarged ends. A nozzle as shown in FIG. 2 having a notch for fitting the part therein is also popular. This type of nozzle can be used for cylindrical electronic parts of various diameters which differs within a predetermined range.

However, when nozzles of these types are used for sucking air-core coils, the air-core coil 3 is sucked being inclined so that the terminals 4 may not be horizontal as shown in FIG. 2. When the air-core coil 3 is pressed against the upper surface of the circuit board under this condition, since the coil turns 5 which are fixed to the nozzle by suction cannot rotate and the terminals 4 are tend to be yielding, the lower terminal is readily deformed to be parallel to the upper surface of the circuit board. At this time, since the upper terminal 4 is not parallel to the upper surface of the circuit board, the terminals 4 of the air-core coil 3 mounted on the circuit board cannot be in close contact with the circuit board, which results in a defective electrical connection.

In many recent automatic electronic part mounting apparatuses, image recognition of the electronic part sucked by the nozzle is performed to correct the position and the angle for mounting. Defective parts are also detected in this process. Electronic parts having their terminals inclined are judged to be defective parts "with inclined leads", and such parts are thrown away. The above-mentioned air-core coil sucked being inclined may be judged to be a defective part "with inclined leads". Then, the air-core coil will be abandoned although it is not defective as a part.

SUMMARY OF THE INVENTION

An object of the present invention is to provide an apparatus and a method for sucking into a nozzle an air-core coil both ends of which serve as terminals protruding from coil turns at the same level in opposite directions in a correct posture so that the terminals are arranged horizontal.

According to the present invention, the posture of the sucked air-core coil is corrected by bringing the terminals of the air-core coil into contact with a horizontal regulating surface and rotating the air-core coil about the axis of coil turns. The posture may be regulated after the air-core coil is sucked by the nozzle or simultaneously with the suction of the air-core coil by the nozzle.

To regulate the posture after the air-core coil is sucked, the air-core coil sucked by the nozzle with a weak suction force is quietly lowered from above a regulating plate having a horizontal upper surface, and the undersurfaces of the terminals of the air-core coil are brought into contact with the upper surface of the regulating plate. Alternatively, a pair of regulating plates whose undersurfaces are horizontally arranged at the same height are provided on a path along which the nozzle sucking the air-core coil is raised, and the upper surfaces of the terminals of the air-core coil are brought into contact with the undersurfaces of the regulating plates. In this case, the suction force is also weakened to facilitate the rotation of the air-core coil about the axis of coil turns. After the posture regulation, the regulating plates are moved to retreated positions so as not to prevent the ascent of the air-core coil.

To regulate the posture simultaneously with the suction, a nozzle is used of a dual structure including an internal member and an external member in which the internal member slides upward and downward relative to the external member. The lower end surface of the external member which is formed to be horizontal serves as a regulating surface, and a notch for sucking the coil turns therein is formed at the lower end of the internal member. When the air-core coil is sucked, the lower end of the internal member is located higher than the lower end of the external member, and the terminals of the air-core coil are brought into contact with the lower end surface of the external member. The internal member is maintained at the same height while the external member is raised to a predetermined height, and the coil turns are sucked into the notch of the internal member. Thereafter, the lower end of the internal member and the lower end surface of the external member are brought to the same height so that only the coil turns are sucked in the notch.

Instead of the nozzle of the dual structure, a nozzle may be used where the lower end surface is horizontal and a concavity capable of holding the entire coil turns therein is formed at the lower end. In this case, the air-core coil is in contact with the nozzle only at the terminals.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 3:
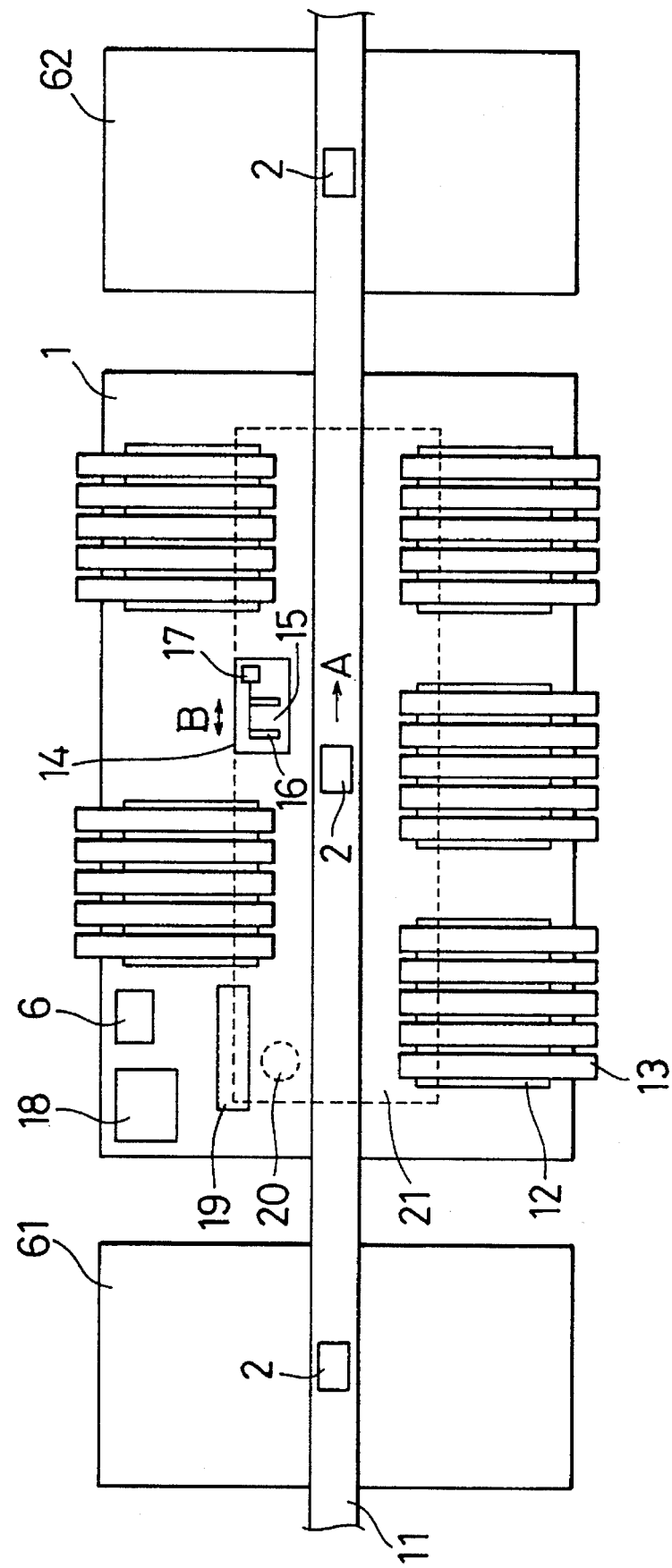
FIG. 3 is a plan view schematically showing an automatic electronic part mounting apparatus employing an air-core coil mounting apparatus of a first embodiment of the present invention.

FIG. 3 is a plan view schematically showing an automatic electronic part mounting apparatus using an air-core coil mounting apparatus according to the present invention. On the left side of an automatic electronic part mounting apparatus 1, an adhesive applying apparatus or solder printing apparatus 61 is provided for applying a UV-hardening polymer or a soldering paste to the upper surface of a printed circuit board 2 where a wiring pattern is formed in advance. On the right side of the automatic electronic part mounting apparatus 1, an adhesive setting apparatus or reflow soldering apparatus 62 is provided for setting the adhesive by irradiating ultraviolet rays to the printed circuit board 2 having the electronic part mounted thereon or for melting the soldering paste by heating the printed circuit board 2 to thereby fix the electronic part to the circuit board 2. In the center in a front-to-rear direction of these apparatuses, a conveyor 11 is provided through the apparatuses to move printed circuit boards 2 from the left to the right in a direction of arrow A. The printed circuit board 2 is placed on the conveyor 11 and passes the adhesive applying apparatus 61, the automatic electronic part mounting apparatus 1 and the adhesive setting apparatus 62.

The conveyor 11 stops when the printed circuit board 2 having an adhesive applied thereon reaches a predetermined position in the automatic electronic part mounting apparatus 1. While the conveyor 11 is stopped, electronic parts are placed on the upper surface of the printed circuit board 2. The conveyor 11 then moves again in the direction of arrow A to convey the circuit board 2 having electronic parts mounted thereon to the adhesive setting apparatus 62 and to convey a new printed circuit board 2 from the adhesive applying apparatus 61 to the predetermined position in the automatic electronic part mounting apparatus 1. As described above, to mount electronic parts on the printed circuit board 2, an adhesive is applied to the circuit board 2, electronic parts are placed thereon, and the adhesive is set.

Figure 19:
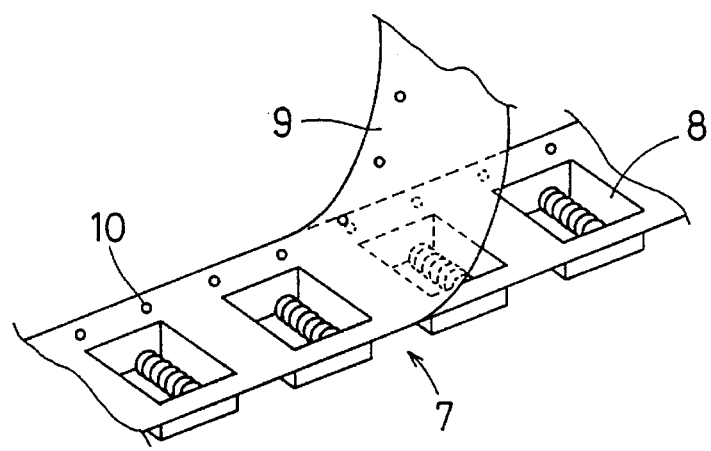
FIG. 19 is a projected perspective view of a tape for supplying air-core coils.

The electronic part is supplied being held in a tape as shown in FIG. 19. The tape 7 is made of plastic and has a large number of pockets 8 formed at predetermined spaces. Each of the pockets 8 holds one electronic part. Since the same type of electronic parts are held in one tape 7, the tape 7 is necessary in number corresponding to the number of kinds of electronic parts mounted on the circuit board 2. The direction of the electronic part in the pocket 8 is predetermined and is associated with the configuration of the sucking portion of a subsequently suction nozzle. In the case of the air-core coil, it is held so that its terminals are in contact with the bottom surface of the pocket 8. The size of the pockets 8, the distance between the pockets 8 and the width of the tape 7 vary according to the size of the part. Various kinds of tapes 7 are available for various kinds of parts. A cover tape 9 is applied to the upper surface of the tape 7 to prevent the parts from falling off, and apertures 10 for feeding the tape are formed at predetermined spaces. The tape 7 holding the parts therein is supplied being wound and contained in a tape cassette.

Returning to FIG. 3, in the automatic electronic part mounting apparatus 1, several metallic stages 12 are provided on both sides of the conveyor 11. To each of the stages 12, a plurality of tape feeders 13 having the tape cassettes mounted thereon are attached so that their front ends face the conveyor 11. The tape feeders 13 send out the tape 7 at a predetermined timing while peeling off the cover tape 9, and bring the electronic part which can be taken out now that the cover tape has been peeled off, to a predetermined position at the front end close to the conveyor 11.

Figure 7:
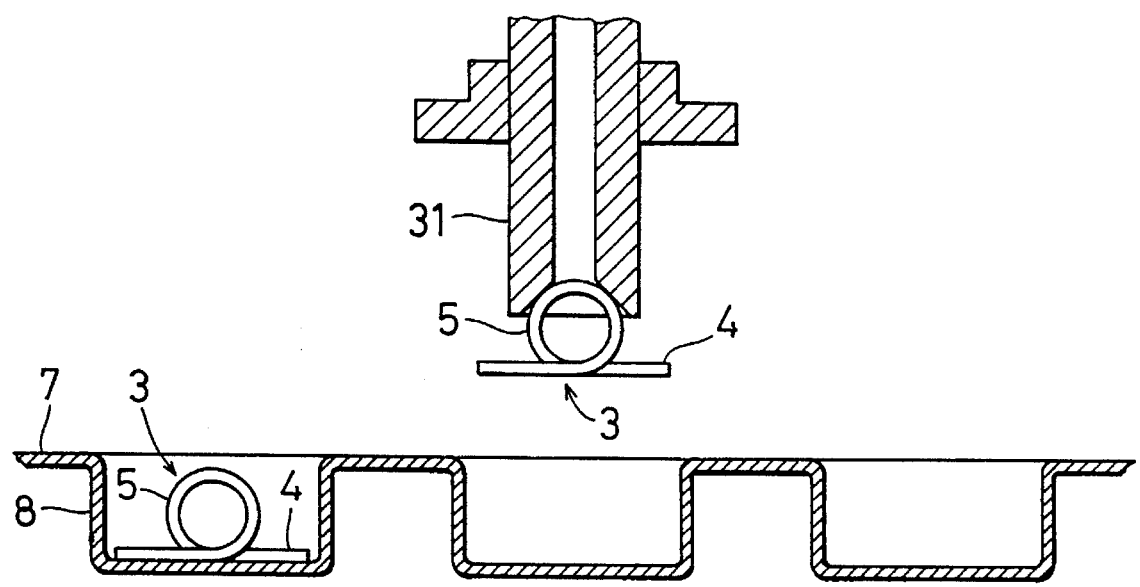
FIG. 7 is a cross-sectional view showing a manner in which an air-core coil is sucked by the nozzle of the first embodiment.

In the vicinity of the position at which the printed circuit board 2 is stopped, a sucked-posture regulator 14 is provided. The sucked-posture regulator 14 includes a regulating plate 15 having a horizontal upper surface, a pair of movable regulating claws 16 arranged to face each other above the regulating plate 15 and a step motor 17 for driving the regulating claws 16. The regulating claws 16 are small in height, parallel to each other, and arranged to be perpendicular to the conveyor 11. The position of the regulating claws 16 corresponds to the direction of the air-core coil 3 held in the pocket 8 of the tape 7 as shown in FIG. 7. The nipping surfaces of the claws 16 are vertical to the axis of coil turn. The regulating claws 16 are moved by the step motor 17 in the directions of arrow B of FIG. 3 to adjust the distance there-between.

Figure 4:
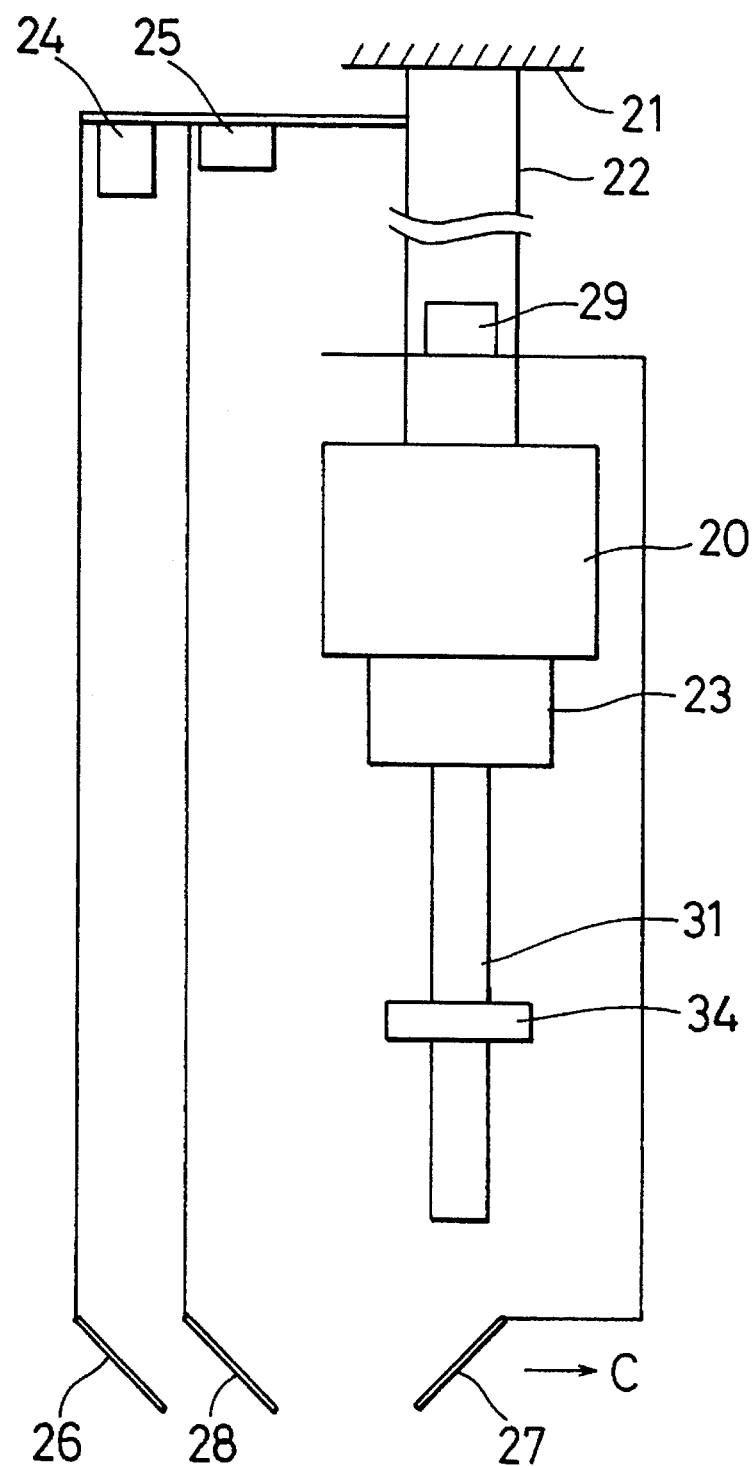
FIG. 4 is a front view schematically showing an arrangement around a mount head of the air-core coil mounting apparatus of the first embodiment.

The automatic electronic part mounting apparatus 1 is provided with a sucker 18 which supplies a suction force for vacuum suction and a nozzle supplier 19 which holds several kinds of suction nozzles and supplies an appropriate nozzle for the electronic part to be mounted. In an upper portion of the apparatus 1, an X-Y table 21 is arranged for horizontally moving a mount head. To the undersurface of the X-Y table 21, a head supporting shaft 22 as shown in FIG. 4 is fixed to protrude downward. To the head supporting shaft 22, a mount head 20 which is movable upward and downward is attached. In a lower portion of the mount head 20, a suction force regulator 23 is provided. The suction force regulator 23 is connected to the sucker 18. The lower end of the suction force regulator 23 is connected to a nozzle 31. The suction force regulator 23 regulates the suction force transmitted from the sucker 18 to the nozzle 31.

To the head supporting shaft 22, a part recognizer is attached. The part recognizer includes a light source 24 which irradiates a parallel light beam downward, a charge coupled device (CCD) sensor 25 which detects a light beam coming from the bottom, a first mirror 26 which horizontally reflects the light beam from the light source 24, a second mirror 27 which upwardly reflects the light beam reflected by the first mirror 26, and a half mirror 28 which is arranged on the optical path of the first and second mirrors 26 and 27 and reflects the light beam from the second mirror 27 toward the CCD sensor 25. The first mirror 26 and the half mirror 28 are fixed at positions lower than the nozzle 31 when the mount head 20 is moved upward to the utmost. The second mirror 27 is arranged at the same height as the first mirror 26 and the half mirror 28. However, the second mirror 27 can horizontally be moved by the step motor 29, and it can be moved to a position just below the nozzle 31 when the mount head 20 is at the highest position. The output of the CCD sensor 25 is processed by a non-illustrated image processor.

The range of operation of the X-Y table 21 is set so that the mount head 20 reaches the nozzle supplier 19 and the front ends of all the tape feeders 13. Therefore, all kinds of parts supplied through tape cassettes can be handled by one mount head 20 by selecting an appropriate nozzle.

Figure 5:
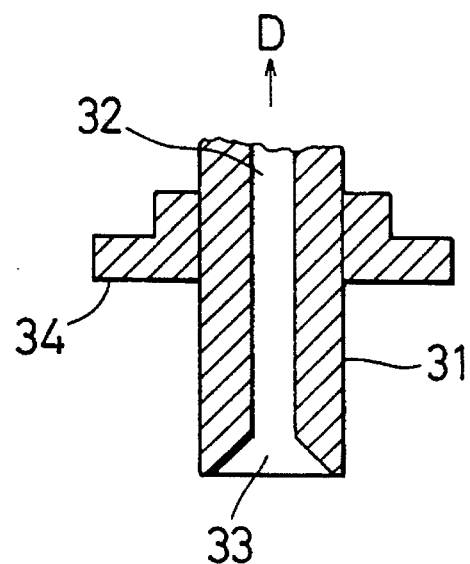
FIG. 5 is a front cross-sectional view of a nozzle of the first embodiment.
Figure 6:
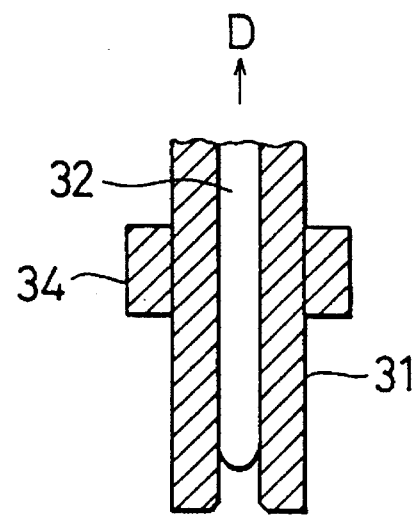
FIG. 6 is a side cross-sectional view of the nozzle of the first embodiment.

FIGS. 5 and 6 are cross-sectional views of the nozzle 31 for sucking air-core coils. The nozzle 31 has a rectangular plane section and is provided with a sucking hole 32 vertically passing through the nozzle 31. The upper end of the sucking hole 32 is connected to the lower end of the suction force regulator 23 so that air is sucked in the direction of arrow D of FIGS. 5 and 6. A notch 33 is formed at the lower end of the nozzle 31, and the coil turns 5 of the sucked air-core coil 3 abut the internal surface of the notch 33 (FIG. 7). At this time, the size of the notch 33 is set so that the lower half of the air-core coil 3 protrudes from the lower end of the nozzle 31 and that the terminals 4 do not come in contact with the nozzle 31. A flange 34 is provided on the external surface of the nozzle 31. The undersurface of the flange 34 and the lower end surface of the nozzle 31 are blackened. These surfaces serve as the background for the part recognition.

The automatic electronic part mounting apparatus 1 is provided with a controller 6 comprising a microcomputer. The supply of electronic parts by the tape feeder 13, the movement of the X-Y table 21, the upward and downward movement of the mount head 20, the selection and change of nozzles by the nozzle supplier 19, the movement of the second mirror 27, the movement of the regulating claws 16 and the regulation of suction force of the nozzle by the suction force regulator 23 are all controlled by taking a timing by the controller 6. The controller 6 has a memory area for storing therein the configuration and dimensions of each electronic part, the order in which the electronic parts are mounted on the circuit board and the position at which the parts are mounted. These data are used for the control.

Figure 1:
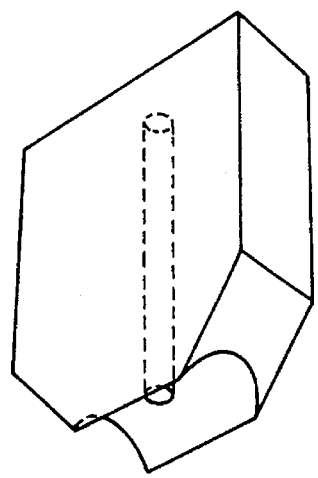
FIG. 1 is a projected perspective view of a suction nozzle of a prior art.
Figure 2:
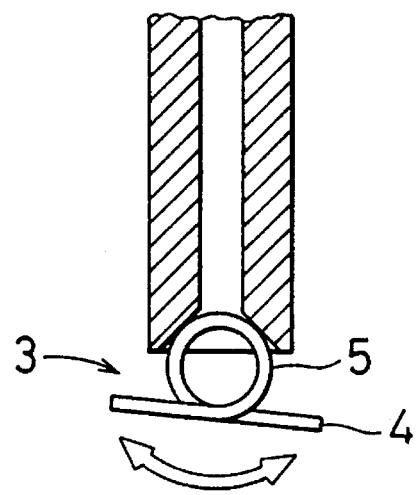
FIG. 2 is a cross-sectional view showing a manner in which an air-core coil is sucked by a nozzle of another prior art.

An operation will be described which is performed when air-core coils are mounted by using the automatic electronic part mounting apparatus 1 having the above-described structure. First, the mount head 20 is moved to the nozzle supplier 19 by the X-Y table 21, and a nozzle 31 suitable for the air-core coil to be mounted is selected and attached to the suction force regulator 23. Then, the mount head 20 is moved to a position above an air-core coil supply position at the front end of a tape feeder 13 which supplies the air-core coil 3 to be mounted. When the nozzle 31 is moved to the position just above the air-core coil 3, the X-Y table 21 is stopped and the mount head 20 is lowered. The mount head 20 is stopped just before the lower end of the nozzle 31 comes in contact with the air-core coil 3, and vacuum suction by the sucker 18 is started to suck the air-core coil 3 up. By the suction, the coil turns 5 of the air-core coil 3 are fitted in the notch 33 of the nozzle 31. At this time, the air-core coil 3 is desirably sucked by the nozzle with its both terminals 4 being horizontal as shown in FIG. 7. However, it is sometimes sucked being inclined as shown in FIG. 2. The mount head 20 is raised with the air-core coil 3 being sucked at the lower end of the nozzle 31 and stopped at the uppermost position.

Then, the part recognition is performed. The second mirror 27 retreating theretofore is moved by the step motor 29 to the position just below the nozzle 31. The light source 24 irradiates light downward. The light is reflected by the first mirror 26 and proceeds horizontally. After passing through the half mirror 28, the light is reflected by the second mirror 27 and proceeds upward. Thereby, light is irradiated on the air-core coil 3 from the downside. The terminals 4 of the air-core coil 3 reflect the light since metal is exposed there for electrical connection. The reflected light is reflected by the second mirror 27 and proceeds toward the half mirror 28. Then, the light is reflected upward by the half mirror 28 and detected by the CCD sensor 25. At this time, since the undersurfaces of the nozzle 31 and the flange 34 are blackened, the terminals 4 of the air-core coil 3 are recognized at an excellent contrast. The output of the CCD sensor 25 is processed by the image processor, and whether the air-core coil 3 is sucked or not and whether the posture of the sucked air-core coil 3 is correct or not are judged. After the part recognition, the second mirror 27 is moved in the direction of arrow C of FIG. 4 to the retreated position.

When no air-core coil 3 is sucked, the tape feeder 13 is instructed to supply the next air-core coil 3. The mount head 20 is lowered to suck the air-core coil 3, and after the mount head 20 is raised again, the part recognition is performed again.

When the air-core coil 3 is sucked in the correct posture, the mount head 20 is moved to the position above the printed circuit board 2 by the movement of the X-Y table 21. Since the position of the air-core coil 3 relative to the nozzle 31 is sensed in the process of part recognition, the air-core coil 3 is more exactly moved to the predetermined position above the printed circuit board 2 by correcting the sensed position. The X-Y table 21 is stopped when the air-core coil 3 reaches the predetermined position, and the mount head 20 is lowered. The speed of the mount head 20 is reduced just before the lower end of the air-core coil 3 comes in contact with the upper surface of the circuit board 2, and the mount head 20 is stopped when the air-core coil 3 is in contact. Thus, the air-core coil 3 is never damaged since it gradually brought into contact with the printed circuit board 2. The vacuum suction is stopped at this point of time, and the mount head 20 is raised and the air-core coil 3 is released from the nozzle 31. Since an adhesive is applied to the printed circuit board 2 in advance at the adhesive applying apparatus 61, the air-core coil 3 is held at the mount position. Since the lower half of the air-core coil 3 protrudes downward from the lower end of the nozzle 31, there is a sufficient gap between the lower end of the nozzle 31 and the upper surface of the circuit board 2, so that the nozzle 31 is never smudged by the adhesive.

When it is judged in the part recognition that the suction direction of the air-core coil 3 to the nozzle 31 is not correct, the X-Y table 21 moves the mount head 20 to a position above the sucked-posture regulator 14. Here the mount head 20 is lowered, and the speed of the mount head 20 is reduced just before the air-core coil 3 comes in contact with the regulating plate 15. Thereafter, the mount head 20 is lowered very slowly. At that time, the suction force is also weakened to a degree at which the air-core coil 3 does not fall off. The descent of the mount head 20 is continued until it reaches a position where both terminals 4 come in contact with the upper surface of the regulating plate 15 when the air-core coil 3 is sucked in the correct direction. In actuality, since the air-core coil 3 is sucked by the nozzle 31 being inclined, one of the terminals comes in contact with the regulating plate 15 first. At this time, since the suction force is weakened, the friction force between the coil turns 5 and the internal surface of the notch 33 of the nozzle 31 is very weak.

Therefore, the air-core coil 3 readily rotates about the axis of coil turns without deforming the terminal which is in contact with the regulating plate 15. Thus, at the point of time when the mount head 20 is stopped, the terminals 4 are both in contact with the regulating plate 15 and the internal surface of the notch 33 of the nozzle 31.

Figure 8:
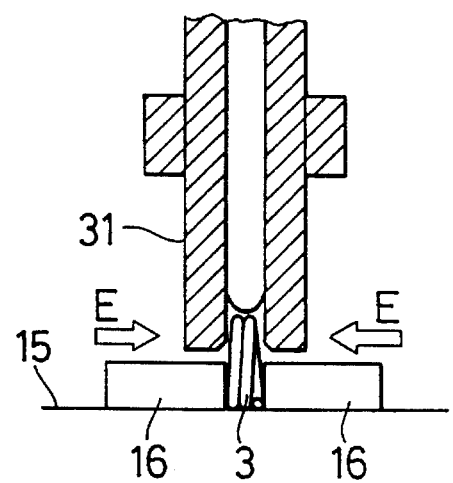
FIG. 8 shows a manner in which the position of the air-core coil is regulated by the air-core coil mounting apparatus of the first embodiment.

Under this condition, the regulating claws 16 are moved by the step motor 17 respectively in the directions of arrows E to reduce the distance therebetween as shown in FIG. 8. The regulating claws 16 are moved until the distance therebetween coincides with the normal length of the air-core coil 3. Thereby, the air-core coil 3 is located at the center coil 3 along the length of the notch 33 of the nozzle 31. Thus, the center of the air-core coil 3 is located just below the sucking hole 32 of the nozzle 31 whether the coil 3 is long or short, so that the suction is surely and appropriately performed. Since the friction force between the air-core coil 3 and the nozzle 31 or the regulating plate 15 is also weakened at this time, the air-core coil 3 is never damaged.

Then, the suction force is increased, the regulating claws 16 are moved so that the distance therebetween increases, and the mount head 20 is raised. Thus, the air-core coil 3 is sucked by the nozzle 31 in the correct direction, i.e. with the terminals 4 being horizontal. When the mount head 20 is raised to the uppermost position, the part recognition is performed again. When it is confirmed that the suction is correctly performed, the air-core coil 3 is mounted on the printed circuit board 2 in the manner described previously. If the direction of the air-core coil 3 should be recognized to be incorrect, it is only when the air-core coli 3 is a defective part. In that case, the defective air-core coil 3 is abandoned, and a new air-core coil 3 is sucked and the above-described process is repeated.

The mounting of one air-core coil 3 onto the circuit board 2 is thus finished and the mounting of the next electronic part is performed. When electronic parts other than the air-core coil are mounted, the required time may be reduced by omitting the regulation of the posture by the sucked-posture regulator 14.

The part recognizer may be fixed inside the automatic electronic part mounting apparatus 1. In that case, however, it is necessary to move the mount head 20 to the part recognizer after the part is sucked, and the time therefor is required. In the arrangement like the present invention where the part recognizer is attached to the head supporting shaft 22 and moved together with the mount head 20, since the part recognition can be performed immediately after the electronic part is sucked, the time required for the mounting is reduced to increase efficiency.

Figure 9:
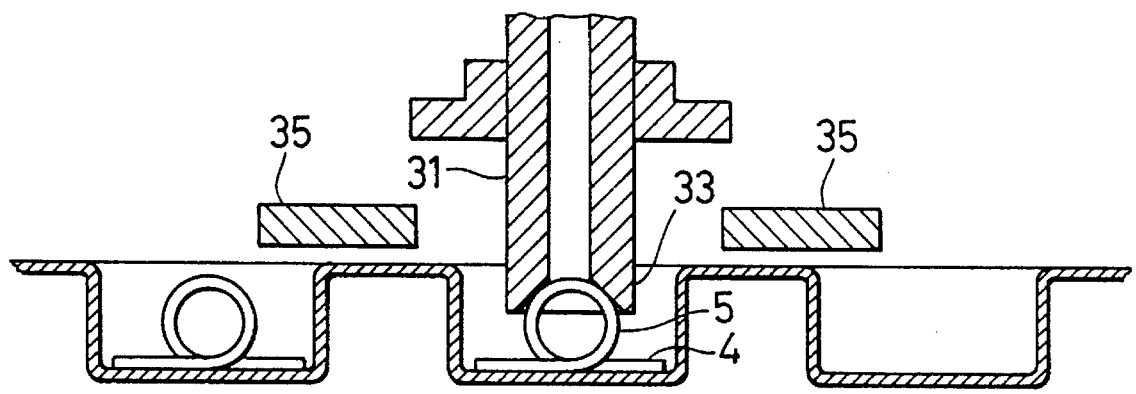
FIG. 9 is a cross-sectional view showing a manner in which an air-core coil is sucked by an air-core coil mounting apparatus of a second embodiment of the present invention.
Figure 10:
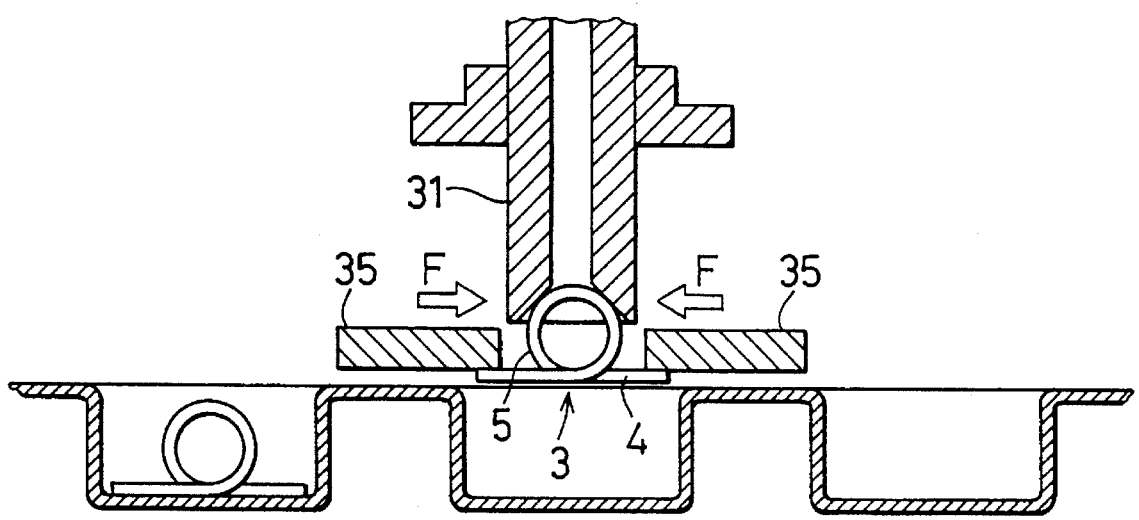
FIG. 10 shows a manner in which the posture of the air-core coil is regulated by the air-core coil mounting apparatus of the second embodiment.
Figure 11:
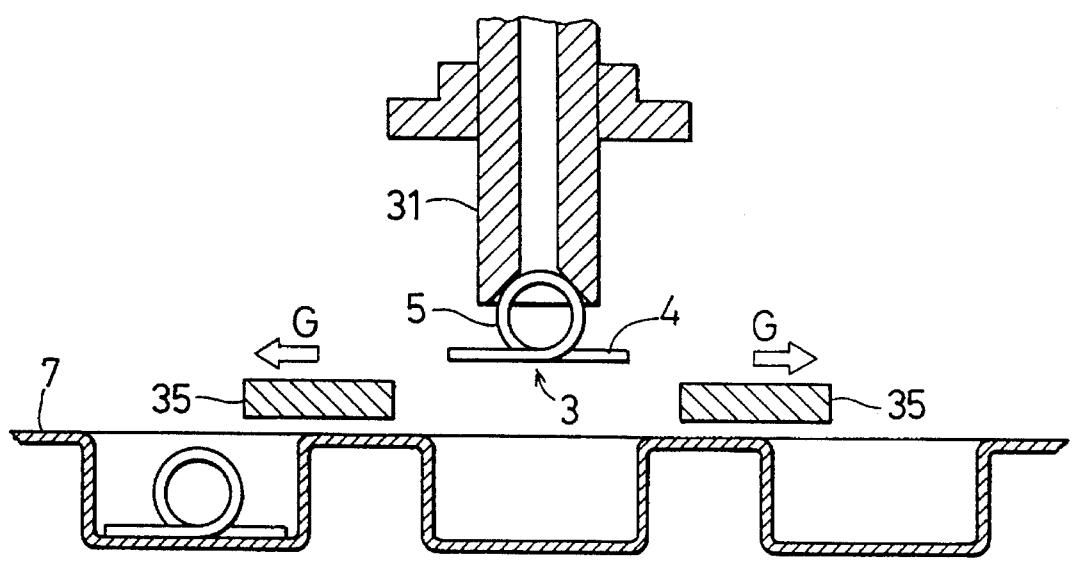
FIG. 11 shows a condition where the posture of the air-core coil has been regulated by the air-core coil mounting apparatus of the second embodiment.

FIGS. 9, 10 and 11 show a manner in which an air-core coil is sucked by an air-core coil mounting apparatus according to a second embodiment of the present invention. The nozzle 31 is the same as that of the first embodiment and has the notch 33 at its lower end. An air-core coil supplier is provided with a pair of movable regulating plates 35. The movable regulating plates 35 are arranged so that their undersurfaces are horizontally arranged at the same level. A non-illustrated step motor drives the movable regulating plates 35 to move horizontally and symmetrically to vary the distance between the plates 35. The movable regulating plates 35 are used instead of the sucked-posture regulator 14 of the first embodiment. The other parts of the automatic electronic part mounting apparatus are the same as those of FIGS. 3 and 4.

An air-core coil sucking operation with this arrangement is as follows. When the nozzle 31 is lowered to suck the air-core coil 3, the movable regulating plates 35 are located at retreated positions where the distance therebetween is increased (FIG. 9). The nozzle 31 stops when or just before it comes in contact with the air-core coil 3. When the suction is started by the sucker 18, the air-core coil 3 is sucked up and its coil turns 5 are fitted in the notch 33. The air-core coil 3 is sometimes sucked in the correct direction as shown in FIG. 7, but is sometimes sucked in the incorrect direction as shown in FIG. 2.

Thereafter, the movable regulating plates 35 are moved in a direction to decrease the distance therebetween (arrow F of FIG. 10) and are stopped with a slight gap with the external surface of the nozzle 31.

The nozzle 31 sucking the air-core coil 3 is raised and stopped when the lower end of the nozzle 31 reaches the vicinity of the undersurfaces of the movable regulating plates 35. Here the suction force is weakened, and the nozzle 31 is slowly raised to a position where the terminals 4 of the air-core coil 3 come in contact with the undersurfaces of the regulating plates 35. Then, the nozzle 31 is stopped again (FIG. 10). Even if the air-core coil 3 is sucked being inclined as shown in FIG. 2, the direction is corrected in this process. Specifically, the nozzle 31 is slowly raised after the upper terminal of the air-core coil 3 sucked being inclined comes in contact with the undersurface of the movable regulating plate 35. At this time, since the suction force is weakened, the friction force between the air-core coil 3 and the nozzle 31 is weak, so that the air-core coil 3 readily rotates about the axis of coil turns without bending the terminal. At the point of time when the nozzle 31 is stopped, the lower terminal is in contact with the undersurface of the movable regulating plate 35, so that the terminals 4 are horizontal.

Thereafter, the suction force is increased to firmly suck the air-core coil 3, and the nozzle 31 is slightly lowered. The movable regulating plates 35 are moved in the direction of arrow G of FIG. 11 to the retreated positions, and the nozzle 31 is raised to the uppermost position. With this, the suction and taking out of the air-core coil 3 from the tape 7 are finished. Thereafter, the part recognition and the mounting on the printed circuit board 2 are performed by the methods described previously.

Figure 12:
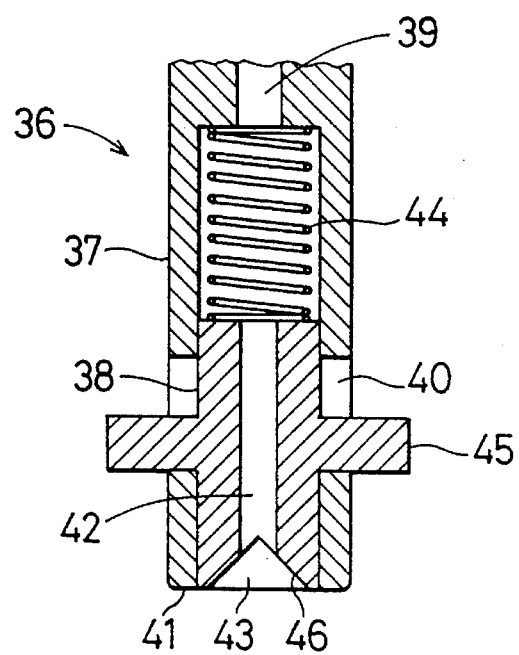
FIG. 12 is a front cross-sectional view of a nozzle of an air-core coil mounting apparatus of a third embodiment of the present invention.
Figure 13:
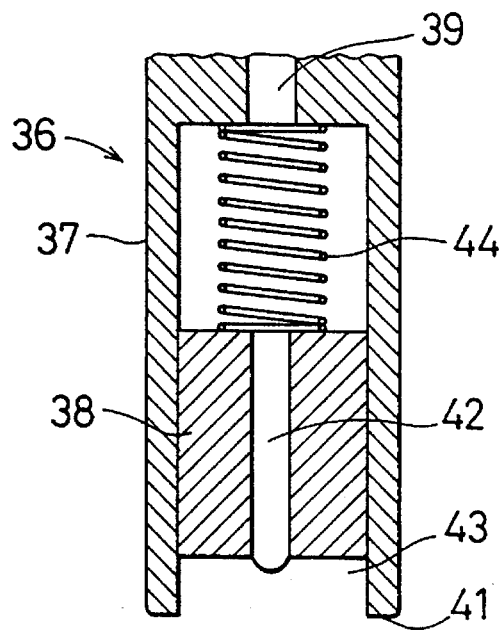
FIG. 13 is a side cross-sectional view of the nozzle of the third embodiment.

FIGS. 12 and 13 show a nozzle according to a third embodiment of the present invention. The nozzle 36 is of a dual structure comprising an external member and an internal member. The external member 37 is attached to the suction force regulator 23. The external member 37 has a rectangular horizontal section, and a core cavity is formed therein from the lower end to a predetermined height for holding the internal member 38 therein. The horizontal section of the core cavity is also rectangular. The external member 37 has a sucking hole 39 passing from the upper end to the inside. On the side surface thereof, a pair of windows 40 vertically long and passing from the external to the internal are formed to face each other. A lower end surface 41 of the external member 37 is formed to be exactly horizontal and serves as a regulating surface for setting the posture of the air-core coil 3 to be sucked.

The internal member 38 slides upward and downward while being substantially in close contact with the internal surface of the external member 37. The internal member 38 has a sucking hole 42 passing from the upper end to the lower end, and has a notch 43 at the lower end. An internal surface 46 of the notch 43 is in contact with the coil turns when the air-core coil is sucked. Above the internal member 38, a compression coil spring 44 is arranged to push down the internal member 38. On the side surface of the internal member 38, a pair of protrusions 45 are provided to protrude out of the windows 40 of the external member 37. The internal member 38 moves upward and downward within the vertical length of the windows 40. When the internal member 38 is pushed down by the compression coil spring 44 so that the protrusions 45 abut the lower ends of the windows 40, the lower end surface of the internal member 38 accords with the lower end surface 41 of the external member 37. The lower end surface of the internal member 38, the surface of the notch 46, the lower end surface 41 of the external member 37 and the undersurface of the protrusion 45 are blackened to facilitate the part recognition.

Figure 14:
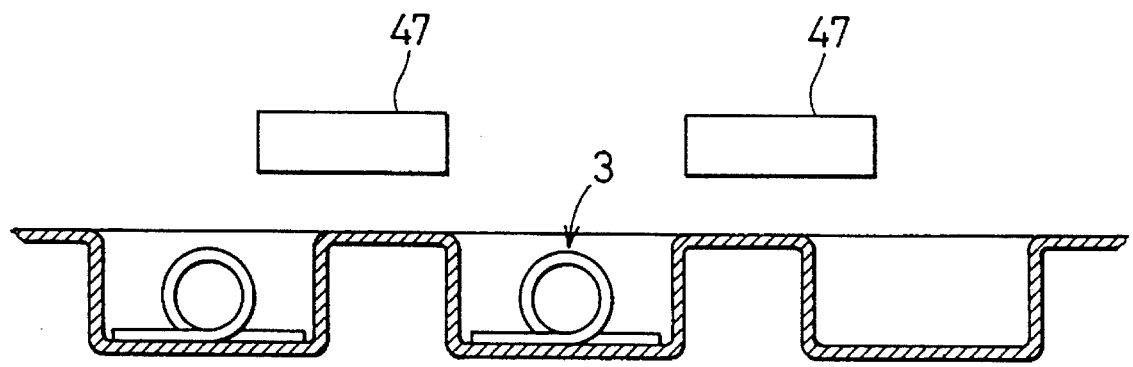
FIG. 14 is a front view of an air-core coil supplier of the third embodiment.

As shown in FIG. 14, a pair of stoppers 47 are fixed above the air-core coil supply position. The stoppers 47 are arranged at appropriate height and space so as not to prevent the external member 37 of the nozzle 36 from descending between the stoppers 47 and so as to abut the protrusions 45 of the internal member 38 to stop the internal member 38 at a predetermined height when the nozzle 36 is lowered.

The nozzle 36 and stoppers 47 of this embodiment are used instead of the sucked-posture regulator 14 of the first embodiment. The other parts of the automatic electronic part mounting apparatus are the same as those of the first embodiment shown in FIGS. 3 and 4, and will not be described here.

Figure 15:
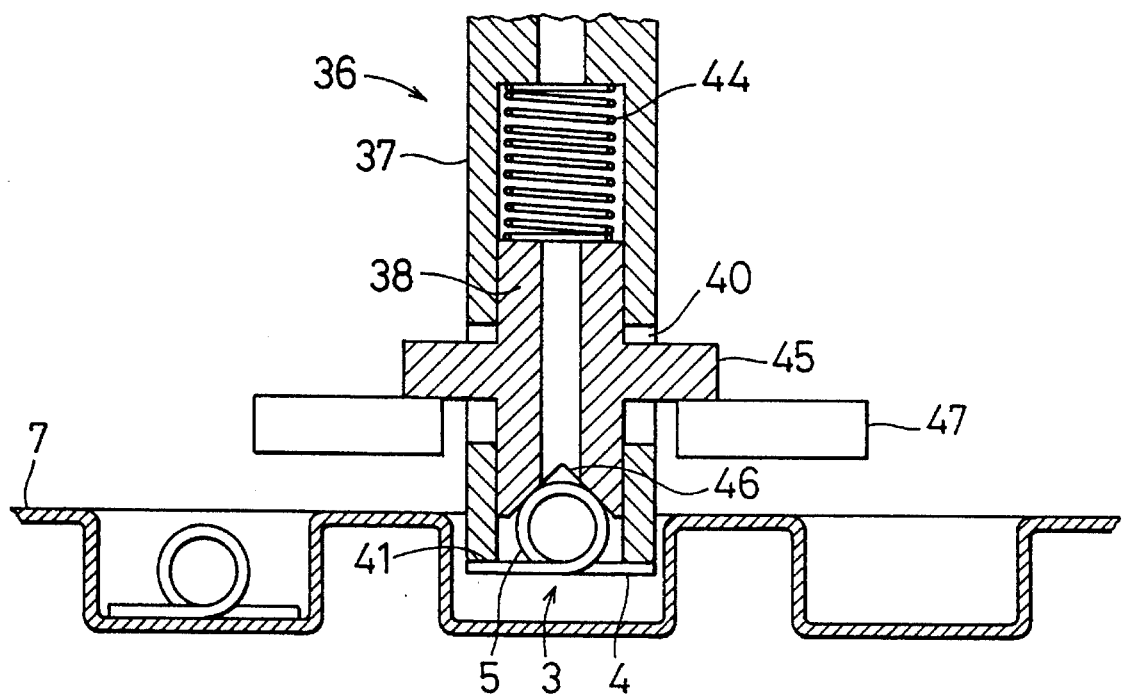
FIG. 15 shows a manner in which the posture of the air-core coil is regulated by the air-core coil mounting apparatus of the third embodiment.

An operation of an air-core coil mounting apparatus of the above-described arrangement will be described. When the nozzle 36 is moved to a position above the air-core coil supplier of the tape feeder 13 by the movement of the X-Y table 21, the mount head 20 is lowered. At this time, as shown in FIG. 12, the internal member 38 of the nozzle 36 is pushed down to the utmost, and the lower end of the internal member 38 and the lower end surface 41 of the external member 37 are at the same height. The mount head 20 is stopped before the lower end surface 41 of the external member 37 comes in contact with the terminals 4 of the air-core coil 3, and vacuum suction by the sucker 18 is started. At this time, as shown in FIG. 15, the protrusions 45 abut the stoppers 47 to restrict the descent of the internal member 38, and the lower end thereof is located higher than the lower end surface 41 of the external member 37. Both of the terminals 4 of the sucked air-core coil 3 are in contact with the lower end surface 41 of the external member 37. The coil turns 5 are in contact with the surface 46 of the notch 43 of the internal member 38 or a slight gap is left therebetween.

Then, the mount head 20 is raised slowly. While the external member 37 is raised as the mount head 20 is raised, the internal member 38 which is pushed down by the compression coil spring 44 remains at the same height until the lower ends of the windows 40 abut the protrusions 45. During this time, the terminals 4 and the coil turns 5 of the air-core coil 3 come in contact with the nozzle 36, and the air-core coil 3 is sucked in an appropriate direction where the terminals 4 are horizontal. Although the terminals 4 are separated from the lower end surface 41 of the external member 37 by the ascent of the external member 37, since the coil turns 5 are sufficiently sucked to the notch 43, the appropriate direction is maintained. The speed of the ascent increases when the protrusions 45 are separated from the stoppers 47, and the mount head 20 is stopped at the uppermost position.

At this point of time, the part recognition is performed in the manner described previously. Thereafter, the air-core 3 is mounted on the printed circuit board 2 like in the first embodiment. In mounting the air-core coil 3 on the circuit board 2, the lower end surface of the nozzle 36 is never smudged by the adhesive since there is a sufficient gap between the lower end surface of the nozzle 36 and the surface of the circuit board 2.

Figure 16:
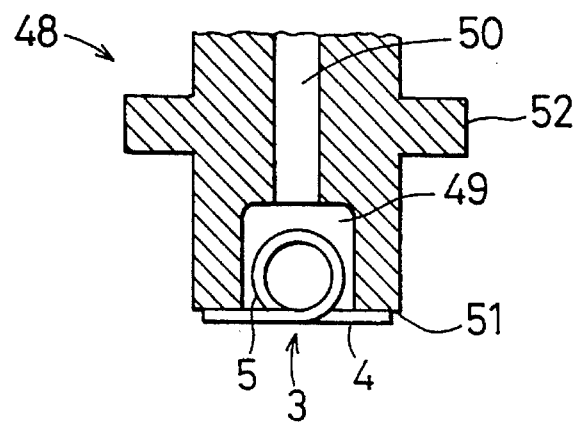
FIG. 16 is a front cross-sectional view showing a manner in which an air-core coil is sucked by a nozzle of a fourth embodiment of the present invention.
Figure 17:
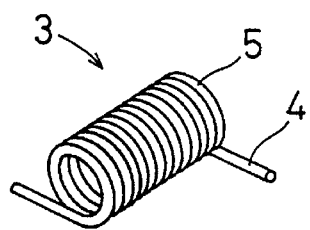
FIG. 17 is a projected perspective view of an air-core coil.
Figure 18:
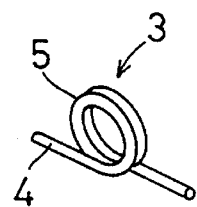
FIG. 18 is a projected perspective view of an air-core coil having a smaller number of coil turns.

FIG. 16 shows a nozzle according to a fourth embodiment of the present invention. The nozzle 48 has a concave 49 for accommodating the coil turns 5 of the air-core coil 3 therein, and is provided with a sucking hole 50 passing from the concave 49 to the upper end of the nozzle 48. Since the concave 49 is formed to be slightly bigger than the coil turns 5, the entire coil turns 5 are held therein. The lower end surface 51 of the nozzle 48 is formed to be exactly horizontal and serves as the regulating surface for setting the direction of the air-core coil 3 to be sucked. The air-core coil 3 is horizontally sucked with its terminals 4 being in contact with the lower end surface 51. Depending on the configuration of the air-core coil, a flange 52 may be provided on the external surface of the nozzle 48. To increase the contrast for the part recognition, the undersurface of the flange 52 and the lower end surface 51 of the nozzle 48 are blackened.

In the nozzle 48 of this arrangement, since the correct direction is set simultaneously with the suction of the air-core coil 3, no time is required for setting the direction.

While Cartesian coordinates type automatic electronic part mounting apparatuses are described in the above embodiments, the apparatuses and methods of the present invention for mounting an air-core coil may be employed for rotary table type automatic electronic part mounting apparatuses having a plurality of pick and place heads.

As described above, according to the present invention, by bringing the lower end surface of the air-core coil in contact with the horizontal regulating plates after or when the air-core coil is sucked by the nozzle, the air-core coil is sucked by the nozzle with its terminals being horizontal. As a result, it is prevented that the terminal is bent when the air-core coil is mounted on the printed circuit board to cause a defective electrical connection and that a perfect air-core coil is recognized to be a defective part by mistake in the part recognition.

Obviously, many modifications and variations of the present invention are possible in light of the above teachings. It is therefore to be understood that within the scope of the appended claims, the invention may be practiced other than as specifically described.

What is claimed is:

1. A method for mounting an air-core coil on a surface of a circuit board, wherein a portion of a coil turn of said air-core coil protrudes from both ends of said air-core coil to serve as terminals of said air-core coil, said method comprising:

sucking the air-core coil into a notch provided at an end of a suction nozzle, abutting a reference surface with said terminals while the air-core coil is sucked into the notch, to regulate the angular position of said coil about the longitudinal axis of the air-core coil, and thereafter, mounting the angularly positioned air-core coil on the surface of the circuit board.

2. A method for mounting an air-core coil according to claim 1, further comprising the steps of:

holding the air-core coil with regulating claws;

moving the air-core coil along the longitudinal axis of the air-core coil relative to the suction nozzle by the regulating claws to regulate a position of the air-core coil relative to the suction nozzle; and causing the regulating claws to release the air-core coil after the air-core coil has been moved along the longitudinal axis by the regulating claws.

3. A method for mounting an air-core coil according to claim 1, further comprising the step of reducing suction force of the suction nozzle when the terminals abut the reference surface.

4. A method for mounting an air-core coil on a surface, wherein a portion of a coil turn of said air-core coil protrudes from both ends of said air-core coil to serve as terminals of said air-core coil, said method comprising:

releasably supporting the air-core coil in a notch provided at an end of a support member, abutting a reference surface with said terminals while the air-core coil is supported in the notch to regulate the angular postion of said coil about the longitudinal axis of the air-core coil, and thereafter, mounting the angularly positioned air-core coil on the surface.

5. A method for mounting an air-core coil according to claim 4, wherein said support member includes a suction nozzle having said notch at an end thereof, and wherein said step of releasably supporting the air-core coil comprises the step of sucking the air-core coil into said notch in said suction nozzle.

* * * * *